United States Patent
Nakao et al.

(10) Patent No.: US 7,109,634 B2
(45) Date of Patent: Sep. 19, 2006

(54) END SURFACE REFLECTION TYPE SURFACE ACOUSTIC WAVE DEVICE

(75) Inventors: Takeshi Nakao, Nagaokakyo (JP);
Kenji Nishiyama, Nagaokakyo (JP);
Tetsuya Kimura, Omlhachiman (JP);
Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 169 days.

(21) Appl. No.: 10/734,228

(22) Filed: Dec. 15, 2003

(65) Prior Publication Data
US 2004/0140734 A1    Jul. 22, 2004

(30) Foreign Application Priority Data
Jan. 20, 2003    (JP) .............................. 2003-011370

(51) Int. Cl.
*H03H 9/25* (2006.01)
(52) U.S. Cl. .............................. 310/313 R; 310/313 A
(58) Field of Classification Search ............ 310/313 R, 310/313 D, 313 A
See application file for complete search history.

(56) References Cited

U.S. PATENT DOCUMENTS

| | | | | |
|---|---|---|---|---|
| 5,260,913 | A * | 11/1993 | Kadota et al. .............. | 367/140 |
| 6,185,801 | B1 * | 2/2001 | Kadota et al. ............. | 29/25.35 |
| 6,236,141 | B1 * | 5/2001 | Sato et al. .............. | 310/313 R |
| 6,731,044 | B1 * | 5/2004 | Mukai et al. ............ | 310/313 R |
| 6,784,764 | B1 * | 8/2004 | Kadota et al. .............. | 333/193 |
| 6,806,795 | B1 * | 10/2004 | Shin .......................... | 333/193 |
| 6,940,208 | B1 * | 9/2005 | Kando .................... | 310/313 R |
| 6,958,565 | B1 * | 10/2005 | Liu ........................ | 310/313 R |

FOREIGN PATENT DOCUMENTS

| | | |
|---|---|---|
| JP | 02-037815 | 2/1990 |
| JP | 08-265088 | 10/1996 |
| JP | 09-186542 | 7/1997 |
| JP | 11-186866 | 7/1999 |

\* cited by examiner

*Primary Examiner*—Thomas M. Dougherty
(74) *Attorney, Agent, or Firm*—Keating & Bennett, LLP

(57) ABSTRACT

A surface acoustic wave device with improved reflection characteristics, in which an insulating film is formed so as to cover an electrode film, and the electrode film is made from Al or an Al alloy, includes a piezoelectric substrate, an electrode film which is formed of Al or an alloy including Al as a major component on the piezoelectric substrate and which defines at least one interdigital transducer, and an insulating film arranged on the piezoelectric substrate so as to cover the electrode film, the average density of the electrode film is less than or equal to about 1.5 times the density of the insulating film, wherein the top surface of the insulating film is planarized.

16 Claims, 10 Drawing Sheets

END SURFACE REFLECTION TYPE SURFACE ACOUSTIC WAVE DEVICE

BACKGROUND OF THE INVENTION

1. Field of the Invention

The present invention relates to a surface acoustic wave device for use as a resonator, a band filter, or other suitable device. More particularly, the present invention relates to an end surface reflection type surface acoustic wave device having a configuration in which an insulating film is formed so as to cover an electrode film which defines an IDT.

2. Description of the Related Art

As piezoelectric substrates for use in surface acoustic wave devices, 36° and 39.5° to 46° rotated Y plate LiTaO$_3$ substrates are widely used. In particular, for RF surface acoustic wave filters, Al or Al alloys are used as materials for forming electrodes such as IDTs (Interdigital Transducers), and the film thickness thereof is approximately 0.08 λ to 0.10 λ when the wavelength of the surface acoustic wave is denoted as λ.

In this type of surface acoustic wave device, in order to improve the temperature coefficient of frequency (TCF), various configurations in which, on a piezoelectric substrate, an insulating film formed of an SiO$_2$ film is formed so as to cover the electrode (see, for example, Japanese Unexamined Patent Application Publication Nos. 2-37815, 8-265088, and 9-186542).

In WO96/4713 and Japanese Unexamined Patent Application Publication No. 1999-186866, a configuration in which the top surface of the insulating film made of SiO$_2$ is planarized is disclosed.

However, in a known surface acoustic wave device in which an insulating film made of SiO$_2$ is formed, a stopband of a sufficient magnitude cannot be obtained. For this reason, when a surface acoustic wave resonator is formed, a large ripple appears in the vicinity of the anti-resonance frequency, and the anti-resonance point disappears. Furthermore, in the surface acoustic wave filter, there is the problem that filter characteristics are not sufficient.

SUMMARY OF THE INVENTION

In order to overcome the problems described above, preferred embodiments of the present invention provide a surface acoustic wave device, in which the above-described problems of the related art are overcome and an insulating film is formed so as to cover the electrode film on a piezoelectric substrate, which is capable of obtaining a stopband of a sufficient magnitude, thereby obtaining satisfactory resonance characteristics and filter characteristics.

According to a preferred embodiment of the present invention, an end surface reflection type surface acoustic wave device includes a piezoelectric substrate having two opposing end surfaces on which a surface acoustic wave is reflected, an electrode film which is formed of Al or an alloy including Al as a major component on the piezoelectric substrate and which defines at least one interdigital transducer, and an insulating film arranged on the piezoelectric substrate so as to cover the electrode film, wherein the top surface of the insulating film is planarized, and the ratio of the average density of the electrode film to the density of the insulating film is less than or equal to about 1.5.

In preferred embodiments of the present invention, an electrode film is preferably formed by Al or an alloy including Al as a major component, and an insulating film is formed so as to cover the electrode film. Furthermore, since the average density of the electrode film is less than or equal to about 1.5 times the density of the insulating film and since an end surface reflection type surface acoustic wave device is formed, a stopband of a sufficient magnitude can be obtained. Therefore, the deterioration of characteristics due to the formation of the insulating film does not occur.

As the insulating film, preferably, an insulating film made of SiO$_2$ is used. This makes it possible to improve the temperature coefficient of frequency TCF.

As the piezoelectric substrate, preferably, an LiTaO$_3$ or LiNbO$_3$ substrate is used. In this case, since piezoelectricity is great, even when the bandwidth ratio is large, a stopband of a sufficient magnitude can be formed, and thus more satisfactory resonance characteristics and filter characteristics can be obtained.

In a specific aspect of the end surface reflection type surface acoustic wave device of preferred embodiments of the present invention, when the wavelength of the surface acoustic wave is denoted as λ, the film thickness Hs/λ of the insulating film made from SiO$_2$ is in the range of about 0.15 to about 0.40. This makes it possible to improve the temperature coefficient of frequency more effectively.

The configuration of the end surface reflection type surface acoustic wave device according to the present invention is not particularly limited, and a surface acoustic wave resonator or a surface acoustic wave filter is formed in accordance with the present invention. Examples of the surface acoustic wave filter include various types such as resonator-type, ladder-type, and lattice-type surface acoustic wave filters, and other suitable filters and devices.

The above and other elements, characteristics, features, steps and advantages of the present invention will become clear from the following description of preferred embodiments taken in conjunction with the accompanying drawings.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

DETAILED DESCRIPTION OF PREFERRED EMBODIMENTS

The present invention will now be described below by describing specific preferred embodiments of the present invention.

Previously, in an RF surface acoustic wave filter, on a piezoelectric substrate formed of an LiTaO$_3$ substrate or an LiNbO$_3$ substrate, an electrode film made of Al or an alloy containing Al as a major component is formed. However, in a rotated Y-cut LiTaO$_3$ substrate or LiNbO$_3$ substrate with great piezoelectricity, there is the problem in that the temperature coefficient of frequency TCF is large as −40 ppm/° C. to −100 ppm/° C.

Accordingly, in order to decrease the temperature coefficient of frequency, a method is known in which an SiO$_2$ film is formed so as to cover an electrode film formed on the surface of the piezoelectric substrate. However, in practice, a surface acoustic wave device in which an SiO$_2$ film is formed has not yet been formed into a product as a surface acoustic wave device for an RF band. This is due to the following reasons. That is, in order to obtain a sufficient electromechanical coupling coefficient and reflection coefficient, the film thickness H/λ of the electrode film is set as thick as 0.08 to 0.10. In this case, it is considered to be due to that the surface of the SiO$_2$ film formed so as to cover the electrode film has irregularities, and the coverage thereof becomes unstable, causing the characteristics to be deteriorated.

On the other hand, it is known that, if the film thickness of the electrode is made thin, such deterioration of characteristics can be suppressed. However, if the film thickness of the electrode is made thin, the electro-mechanical coupling coefficient decreases.

Accordingly, the inventors of the present invention studied a method for reducing the deterioration of characteristics by the formation of an SiO$_2$ film while the film thickness of the electrode is kept thick. As a result, the inventors of the present invention discovered that, if the surface of the SiO$_2$ film is planarized, the deterioration of characteristics due to the formation of an SiO$_2$ film can be reduced even when the film thickness of the electrode is made thick.

However, when Al or an Al alloy is used as an electrode material, it was discovered that the following problems exist. These problems will now be described based on specific experimental examples with reference to FIGS. 2A, 2B, and 3.

Figure 2A:
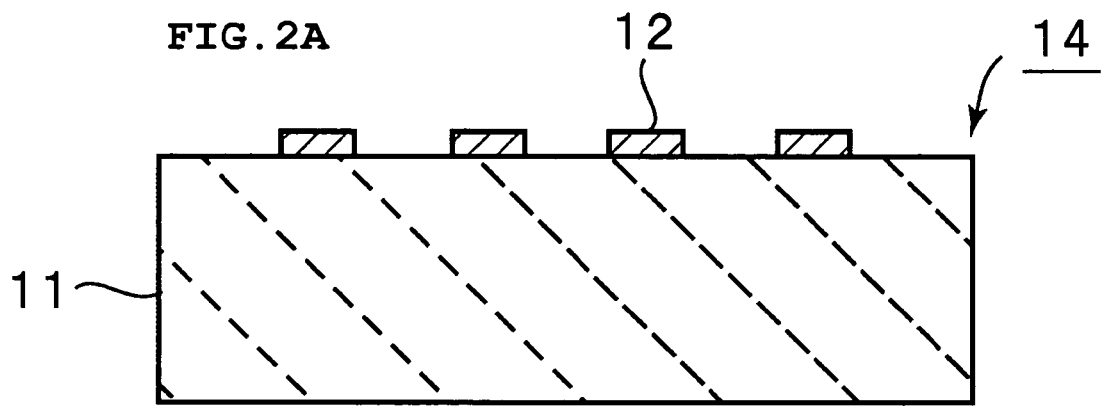
FIGS. 2A and 2B are each a front sectional view illustrating a known surface acoustic wave device.

As shown in FIG. 2A, a resonator 14 such that an IDT 12 made of Al is formed on a piezoelectric substrate 11 formed of a 36° Y-cut X-propagation LiTaO$_3$ substrate is provided.

Figure 2B:
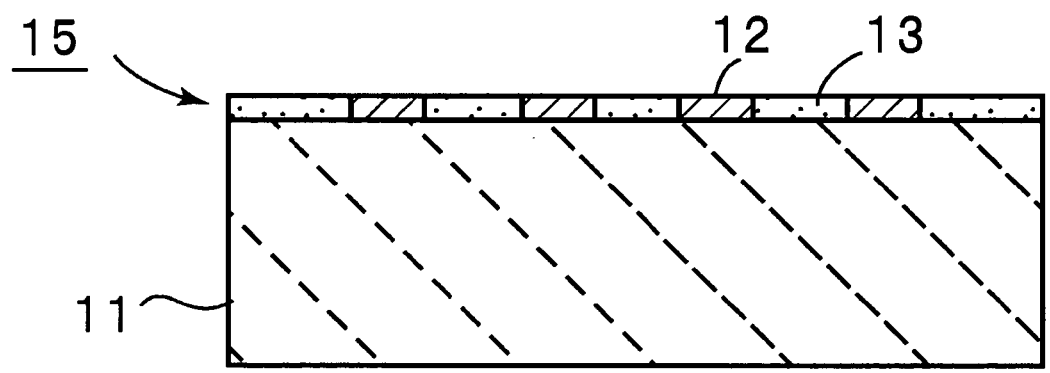

Furthermore, as shown in FIG. 2B, in order to planarize the surface of the SiO$_2$ film, an SiO$_2$ film 13 is formed so as to become the same film thickness as that of the IDT 12 in an area where the IDT 12 is not provided, thus forming a surface acoustic wave resonator 15.

Although the illustration is omitted, in FIGS. 2A and 2B, a pair of grating reflectors was formed on both sides of the IDT 12 along the surface-acoustic-wave propagation direction. That is, the surface acoustic wave resonators 14 and 15 are one-port-type surface acoustic wave resonators with a reflector.

Figure 3:
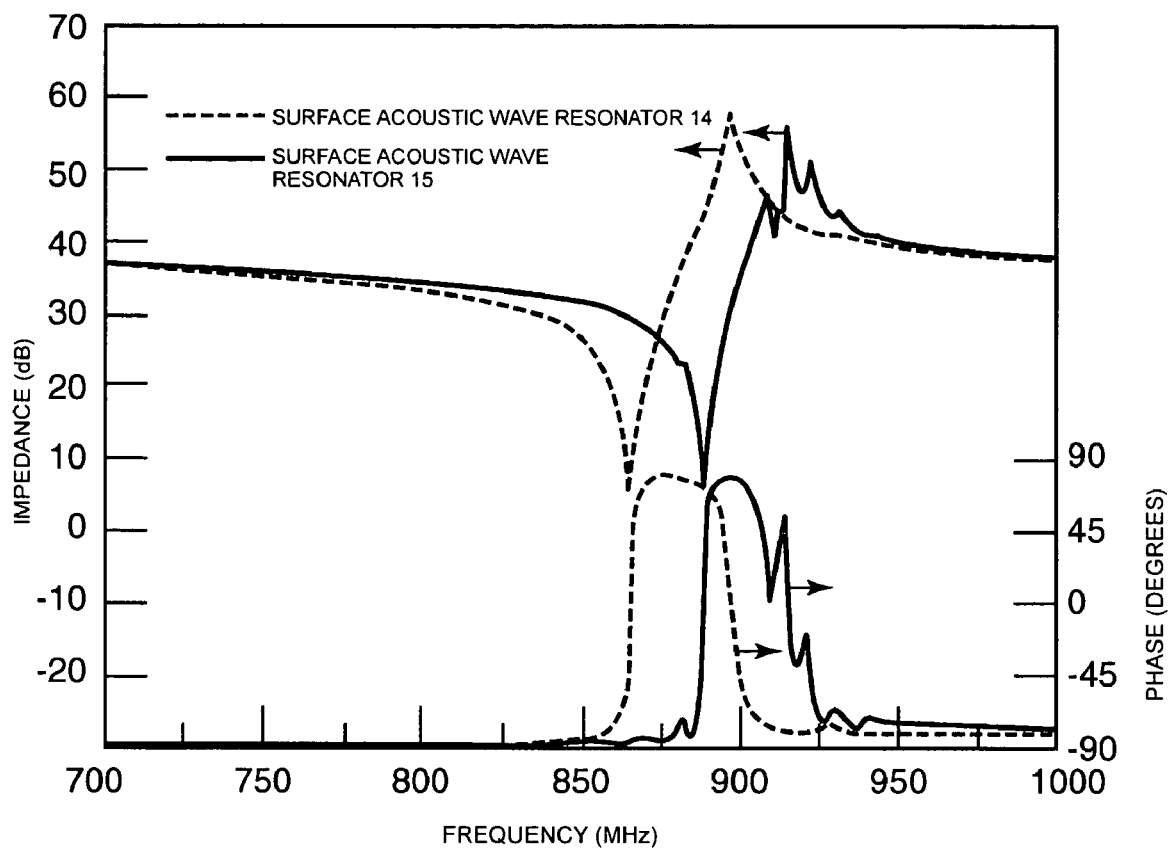
FIG. 3 shows the impedance versus frequency characteristics and the phase versus frequency characteristics of the surface acoustic wave devices shown in FIGS. 2A and 2B.

The impedance versus frequency characteristics and the phase versus frequency characteristics of the surface acoustic wave resonator 15 shown in FIG. 2B are indicated by the solid lines in FIG. 3. Furthermore, the impedance versus frequency characteristics and the phase versus frequency characteristics of the surface acoustic wave resonator 14, in which the SiO$_2$ film 13 is not formed, shown in FIG. 2A, are indicated by the broken lines in FIG. 3. As can be seen from the solid lines in FIG. 3, in the surface acoustic wave resonator 15, since the reflection coefficient is insufficient, a sufficient stopband cannot be formed, and as a result, a lot of ripples indicated by the arrow A are generated in the vicinity of the anti-resonance frequency.

According to the experiments by the inventors of the present invention, it was ascertained that, even if an SiO$_2$ film is formed on the top surface of the surface acoustic wave resonator 15 shown in FIG. 2B, the ripples A cannot be reduced. These ripples occur because the reflection by the IDT 12 made of Al is insufficient. That is, it is considered that, since SiO$_2$ whose density does not differ much from that of Al is buried between electrode fingers, the difference in the acoustic impedances between the electrode fingers and SiO$_2$ becomes small, causing the mechanical reflection of the surface acoustic wave to be decreased.

Figure 4A:
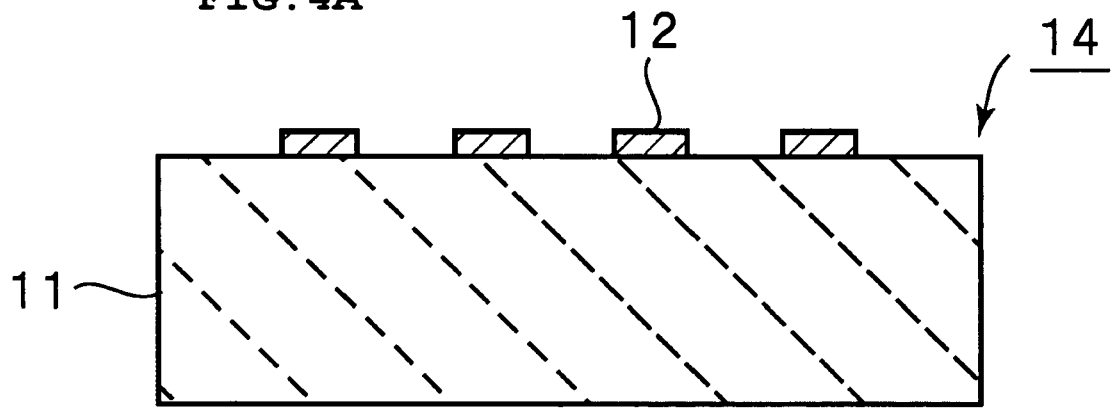
FIGS. 4A and 4B are each a front sectional view illustrating another example of the known surface acoustic wave device.
Figure 4B:
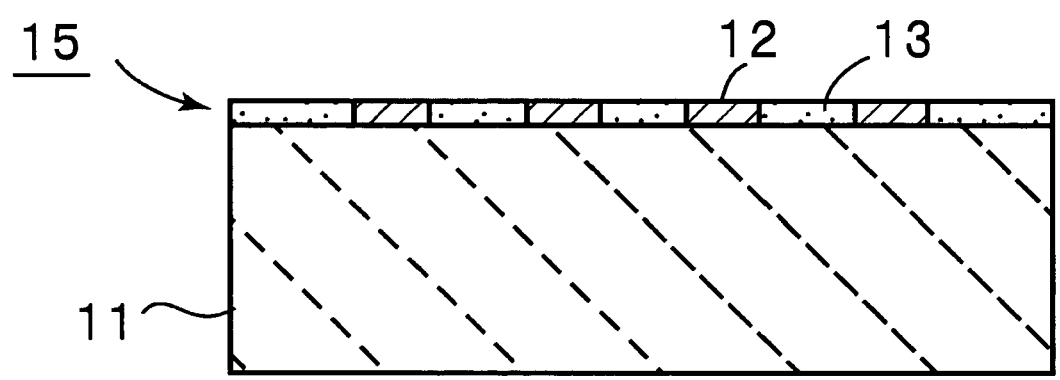
Figure 5:
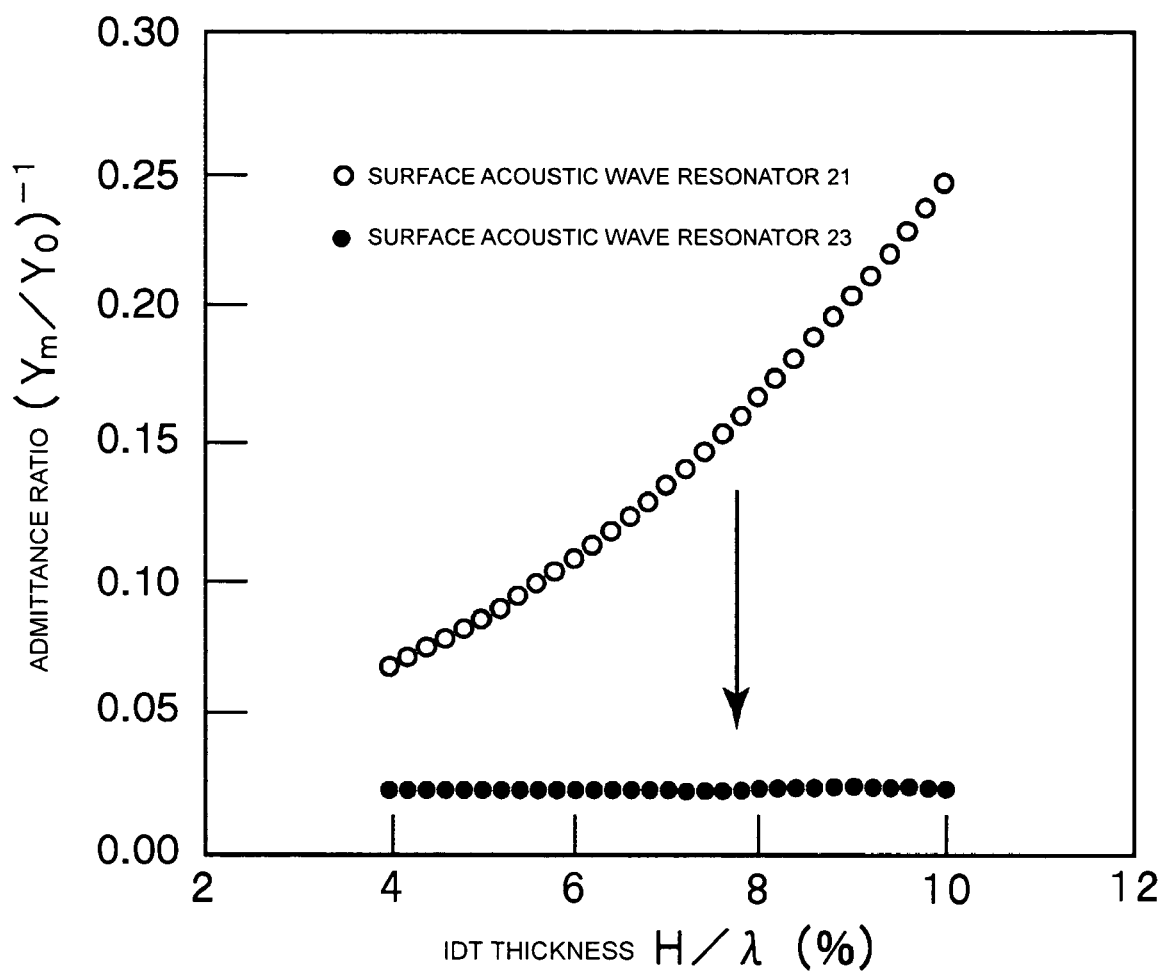
FIG. 5 shows the change of the acoustic admittance ratio in a case where the film thickness of the IDT in the surface acoustic wave device shown in FIGS. 4A and 4B is changed.

Next, the relationship between the film thickness of the electrode film of each of the surface acoustic wave resonators, shown in FIGS. 4A and 4B, in which an SiO$_2$ film was formed, and the acoustic admittance ratio was investigated. The results are shown in FIG. 5.

In the surface acoustic wave resonator 21 shown in FIG. 4A, the IDT 12 is formed on the piezoelectric substrate 11, and an SiO$_2$ film 22 is formed so as to cover the IDT 12. But then, the top surface of the SiO$_2$ film 22 is not planarized. That is, since the IDT 12 is formed, the top surface of the SiO$_2$ film rises above the portion where the electrode fingers of the IDT 12 are formed.

In comparison, in the surface acoustic wave resonator 23 shown in FIG. 4B, the IDT 12 is formed on the piezoelectric substrate 11, and the SiO$_2$ film 13 is formed so that the sections between the electrode fingers of the IDT 12 are buried. That is, the surface acoustic wave resonator 23 has a configuration similar to the configuration shown in FIG. 2B. Then, an SiO$_2$ film 24 having a fixed thickness is further formed on the IDT 12 and the SiO$_2$ film 13.

Also, in the surface acoustic wave resonators 21 and 23, similarly to the surface acoustic wave resonators 14 and 15, a pair of reflectors are arranged on both sides of the IDT 12 along the propagation direction of the surface acoustic wave. That is, the surface acoustic wave resonators 21 and 23 are one-port-type surface acoustic wave resonators with a reflector.

The change of the acoustic admittance ratio in a case where the film thickness H/λ of the IDT 12 of the surface acoustic wave resonators 21 and 23 is changed is shown in FIG. 5. In FIG. 5, $Y_m$ indicates the acoustic admittance of the electrode section, and $Y_O$ indicates the acoustic admittance of the gap portion. The acoustic admittance ratio is the reciprocal of the acoustic impedance, and is nearly proportional to the reflection coefficient. In FIG. 5, ○ indicates the result of the surface acoustic wave resonator 21, and ● indicates the result of the surface acoustic wave resonator 23.

As can be seen from FIG. 5, when the IDT 12 made from Al or an Al alloy is used, the reflection is decreased as a result of the top surface of the insulating film made from $SiO_2$ being planarized, and in this case, even if the film thickness of the electrode made from Al or an Al alloy is increased, the reflection is not increased. Based on the results of FIG. 5, the inventors of the present invention made studies considering that the use of the end surface reflection allows the characteristics to be improved.

Figure 1A:
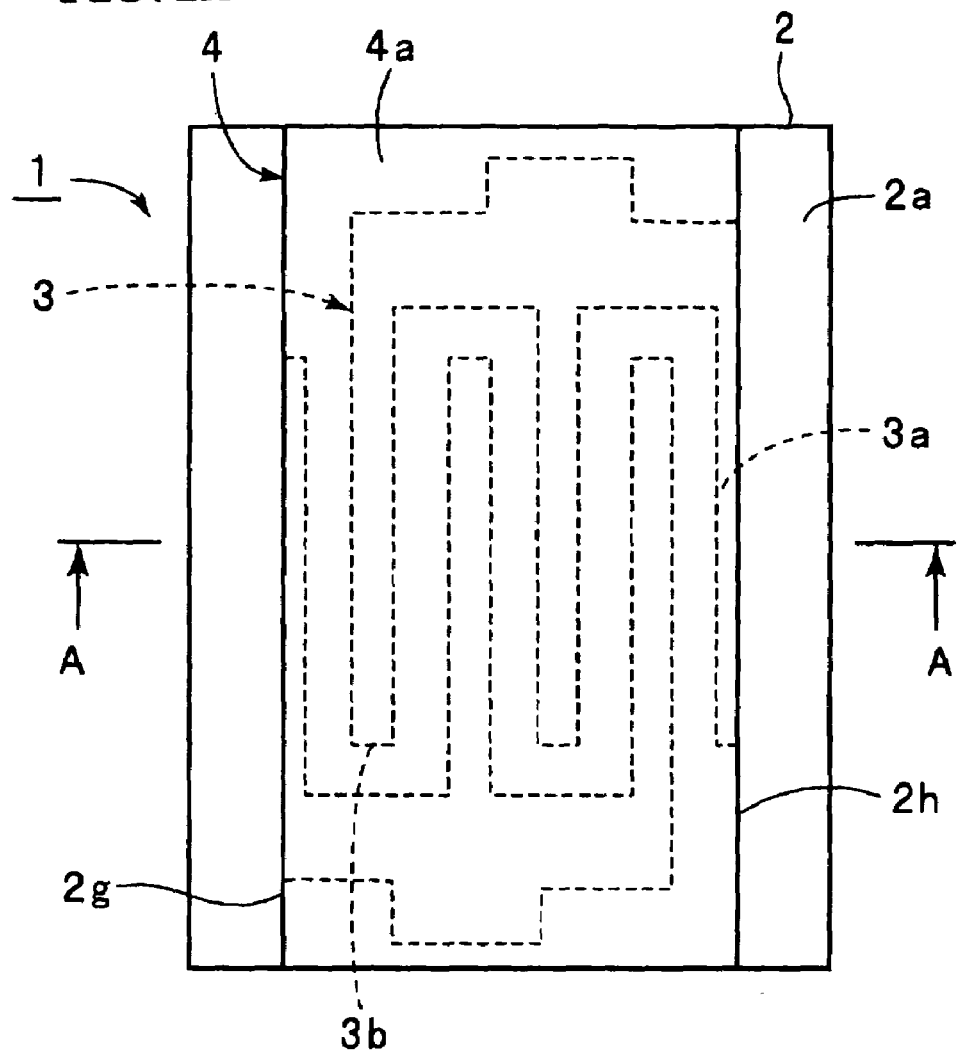
FIGS. 1A and 1B are respectively a plan view of a surface acoustic wave device according to a preferred embodiment of the present invention and a front sectional view taken along the line A—A in FIG. 1A.
Figure 1B:
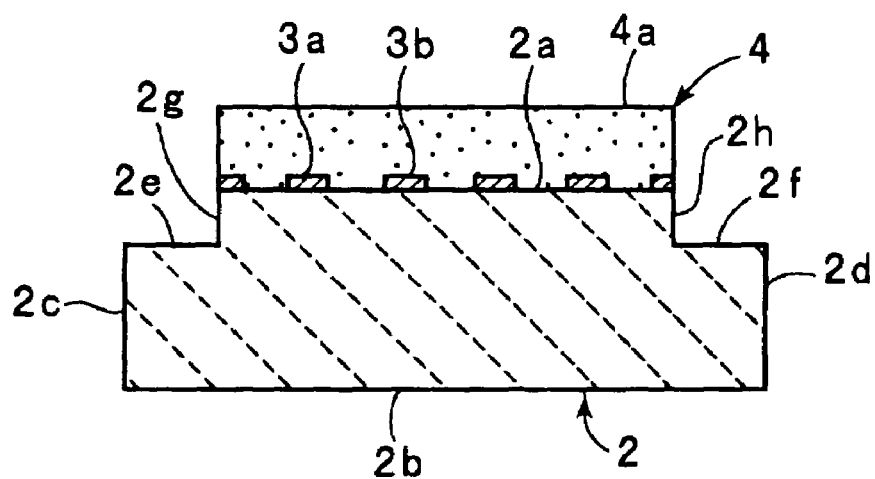

FIGS. 1A and 1B are respectively a plan view of a surface acoustic wave device according to a preferred embodiment of the present invention and a sectional view taken along the line A—A in FIG. 1A.

A surface acoustic wave device 1 is an end surface reflection type one-port-type surface acoustic wave resonator. The surface acoustic wave device 1 has a piezoelectric substrate 2. In this preferred embodiment, the piezoelectric substrate 2 is preferably formed of a 36° rotated Y-plate X-propagation $LiTaO_3$ substrate. The piezoelectric substrate 2 may be formed by an $LiTaO_3$ substrate of another cut angle. Furthermore, the piezoelectric substrate 2 may be formed by an $LiNbO_3$ substrate or other suitable substrate. Since the $LiTaO_3$ substrate and the $LiNbO_3$ substrate have a large piezoelectricity, and since the bandwidth ratio is larger than the stopband, the advantages by the present invention are great.

The piezoelectric substrate 2 preferably has a shape nearly in the form of a rectangular plate, and has a top surface 2a and an under surface 2b. Furthermore, the sides 2c and 2d of the piezoelectric substrate 2 are preferably formed with step differences 2e and 2f, respectively, at a position of a middle height. The side portions above the step differences 2e and 2f form reflection end surfaces 2g and 2h. The reflection end surfaces 2g and 2h extend substantially parallel to each other and are formed as planarized surfaces. The side portions below the step differences 2e and 2f need not be flat surfaces, and preferably, the side portions are rough surfaces for the purpose of reducing the influence of a bulk wave.

The reflection end surfaces 2g and 2h can easily be formed by forming electrodes on the wafer and thereafter forming grooves.

On the top surface 2a of the piezoelectric substrate 2, an IDT 3 is formed. The IDT 3 is formed of a pair of comb electrodes 3a and 3b. The electrode fingers of each of the comb electrodes 3a and 3b of the IDT 3 extend in a direction substantially parallel to the reflection end surfaces 2g and 2h.

In this preferred embodiment, the IDT 3 is preferably made from Al.

On the top surface 2a of the piezoelectric substrate 2, an $SiO_2$ film 4 is formed as an insulating film so as to cover the IDT 3. The top surface 4a of the $SiO_2$ film 4 is planarized. That is, the $SiO_2$ film 4 is formed so as to fill in the area between the electrode fingers of the IDT 3, so as to cover the top surface of the IDT 3, and such that the top surface 4a is flat. The fact that the top surface 4a of the $SiO_2$ film 4 is flat means that the irregularities between the top surface of the $SiO_2$ film portion above the portion where the electrode fingers of the piezoelectric substrate 2 are provided and the top surface of the $SiO_2$ film in the area between the electrode fingers is approximately 30% or less of the film thickness of the IDT 3. When the top surface 4a of the $SiO_2$ film 4 is planarized to such a degree, the deterioration of the characteristics due to the formation of the $SiO_2$ film 4 is small.

Now, as the surface acoustic wave device 1, the piezoelectric substrate 2 was provided, and on the piezoelectric substrate 2, as the IDT 3, an electrode film made from Al, having a thickness of, for example, about 360 nm, in which the cross width of the electrode fingers is, for example, about 70 μm and the number of pairs of the electrode fingers is, for example, 75, was formed. Then, the thickness of the $SiO_2$ film was set at about 900 nm. The impedance versus frequency characteristics of the surface acoustic wave device 1 formed in this manner are indicated by the solid line in FIG. 6. The broken line in FIG. 6 indicates the characteristics of the surface acoustic wave resonator provided as a comparative example. The surface acoustic wave resonator of the comparative example is a one-port-type surface acoustic wave resonator which is configured similarly to the above-described preferred embodiment except that a pair of reflectors whose material and film thickness are the same as those of the IDT 3 are arranged on both sides of the IDT along the propagation direction of the surface acoustic wave.

Figure 6:
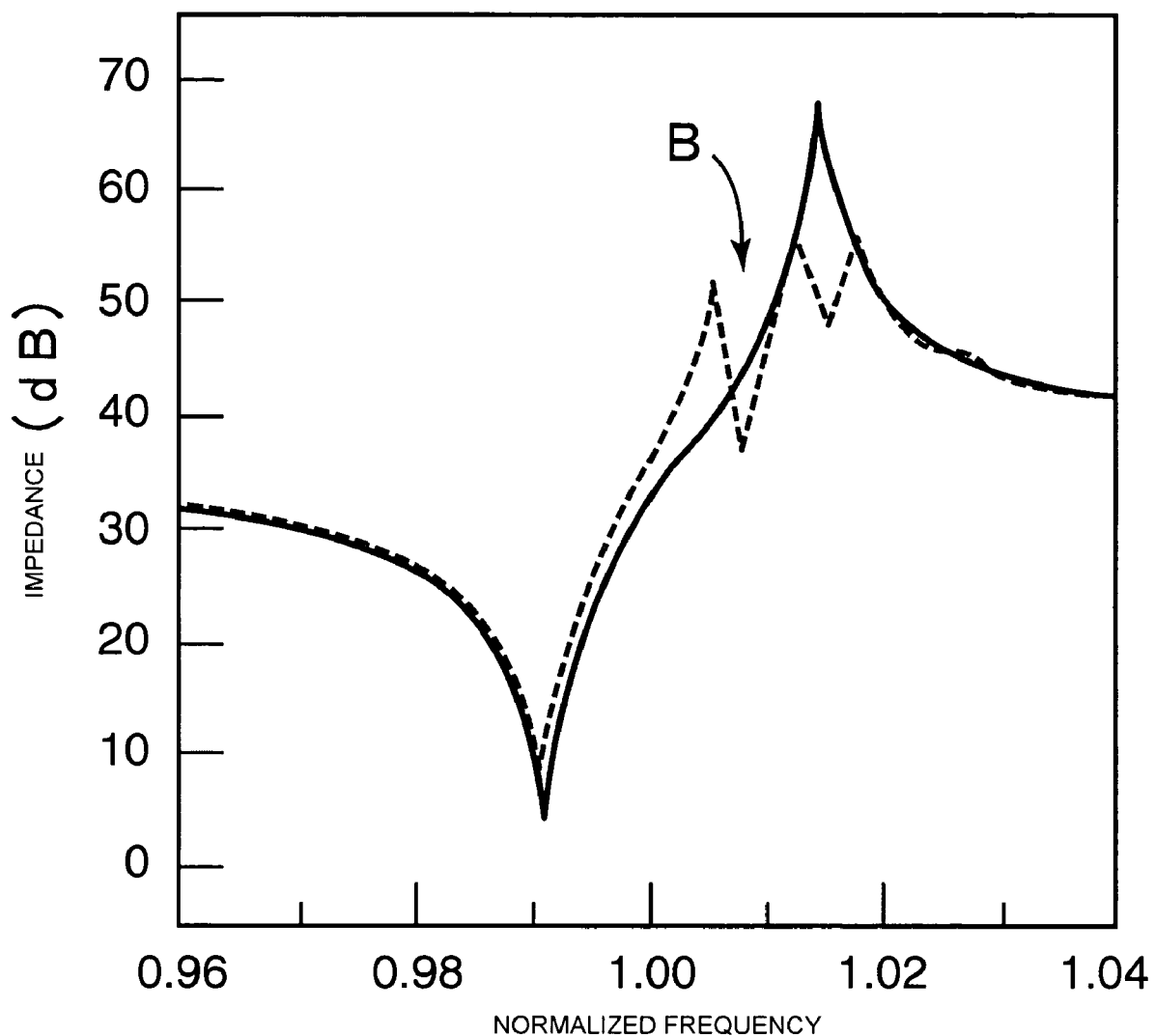
FIG. 6 shows the impedance versus frequency characteristics of the surface acoustic wave device of the preferred embodiment shown in FIGS. 1A and 1B, and a surface acoustic wave resonator having a reflector provided for comparison.

As is clear from FIG. 6, in the surface acoustic wave resonator of the comparative example, a lot of ripples indicated by the arrow B appear in the vicinity of the anti-resonance frequency. That is, it can be seen that, even if an $SiO_2$ film is formed so as to cover the IDT made from Al and the surface of the $SiO_2$ film is planarized, a sufficient stopband cannot be obtained in the surface acoustic wave resonator having a reflector. In contrast, it can be seen that, in the surface acoustic wave device 1 of the present preferred embodiment, such ripples do not appear in the vicinity of the anti-resonance frequency.

More specifically, according to this preferred embodiment, in a configuration in which the IDT 3 and the $SiO_2$ film 4 are formed on the piezoelectric substrate 2 and the surface of the $SiO_2$ film 4 is planarized, it can be seen that, even when the IDT 3 is formed by Al, a stopband of a sufficient magnitude can be obtained, and ripples in the vicinity of the anti-resonance frequency can be greatly reduced.

Examples of the method of planarizing the surface of the insulating film, which is not particularly limited, includes the following first and second methods.

In the first method, an insulating film is formed on a piezoelectric substrate, and a resist is coated on the insulating film. Thereafter, the resist of the electrode formed portion is removed by photo-lithography, and after that, the insulating film of the electrode formed portion is removed by etching. Next, a metal film for forming an electrode is deposited. Then, by lifting off the resist together with an unnecessary metal film for forming an electrode above the resist, the surface of the electrode and the insulating film can be planarized.

The second method is a method in which, after an insulating film is formed so as to cover an electrode, irregularities on the surface of the insulating film are made flat by etchback, ion milling, or other suitable process.

Based on the results of the above-described preferred embodiment, the inventors of the present invention further investigated the relationship between the film thickness Hs/λ of the $SiO_2$ film when $LiTaO_3$ and $LiNbO_3$ substrates of various cut angles were used, and the temperature coefficient of frequency TCF. The results are shown in FIGS. 7 and 8.

Figure 7:
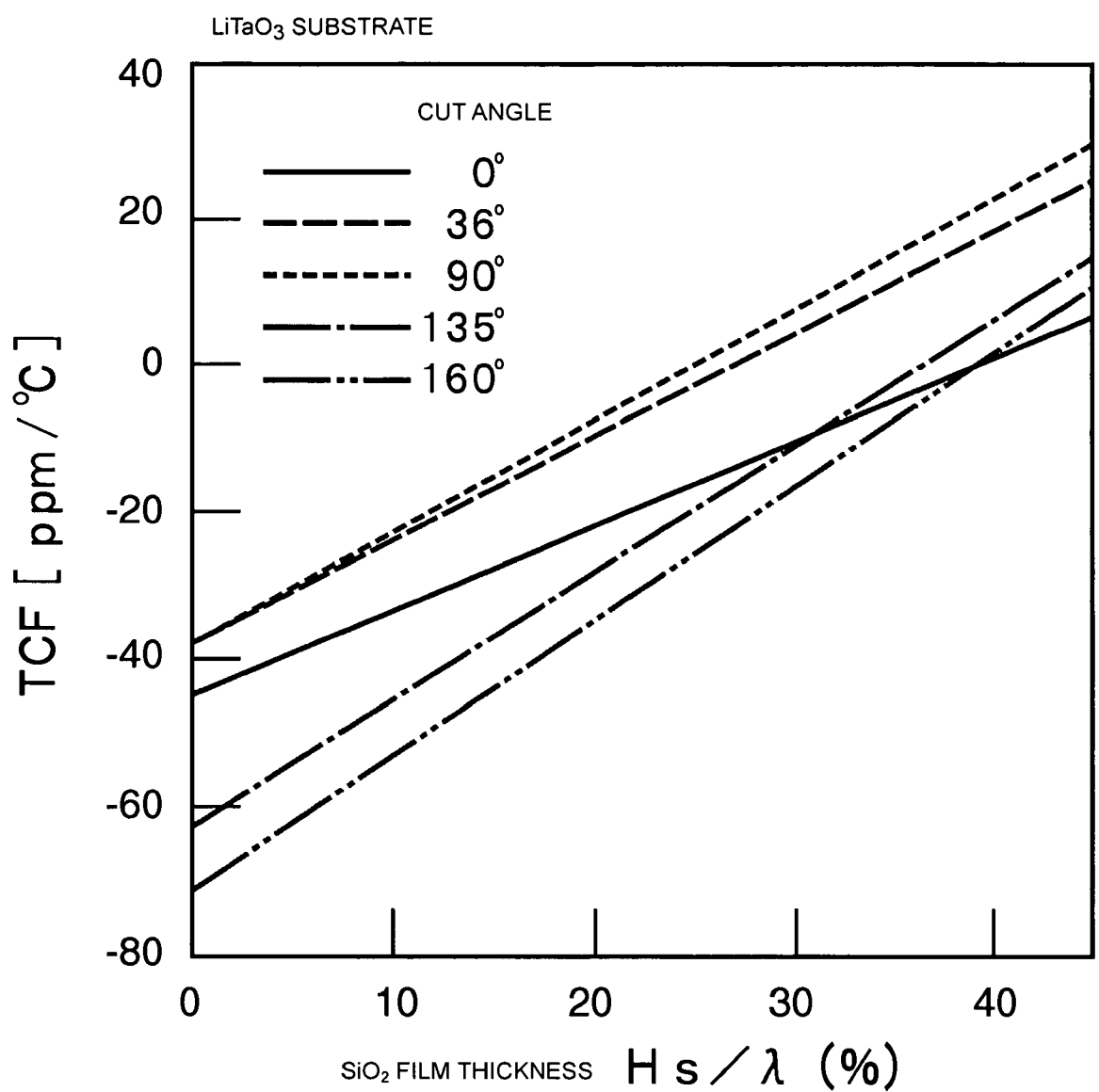
FIG. 7 shows the change of the temperature coefficient of frequency TCF in a case where, in the surface acoustic wave device of a preferred embodiment of the present invention, LiTaO$_3$ substrates of various cut angles are used, and the film thickness of the SiO$_2$ film is changed.

FIG. 7 shows the results when a Y-cut $LiTaO_3$ substrate was used. FIG. 8 shows the results when a 5° to 64° Y-cut $LiNbO_3$ substrate was used.

Figure 8:
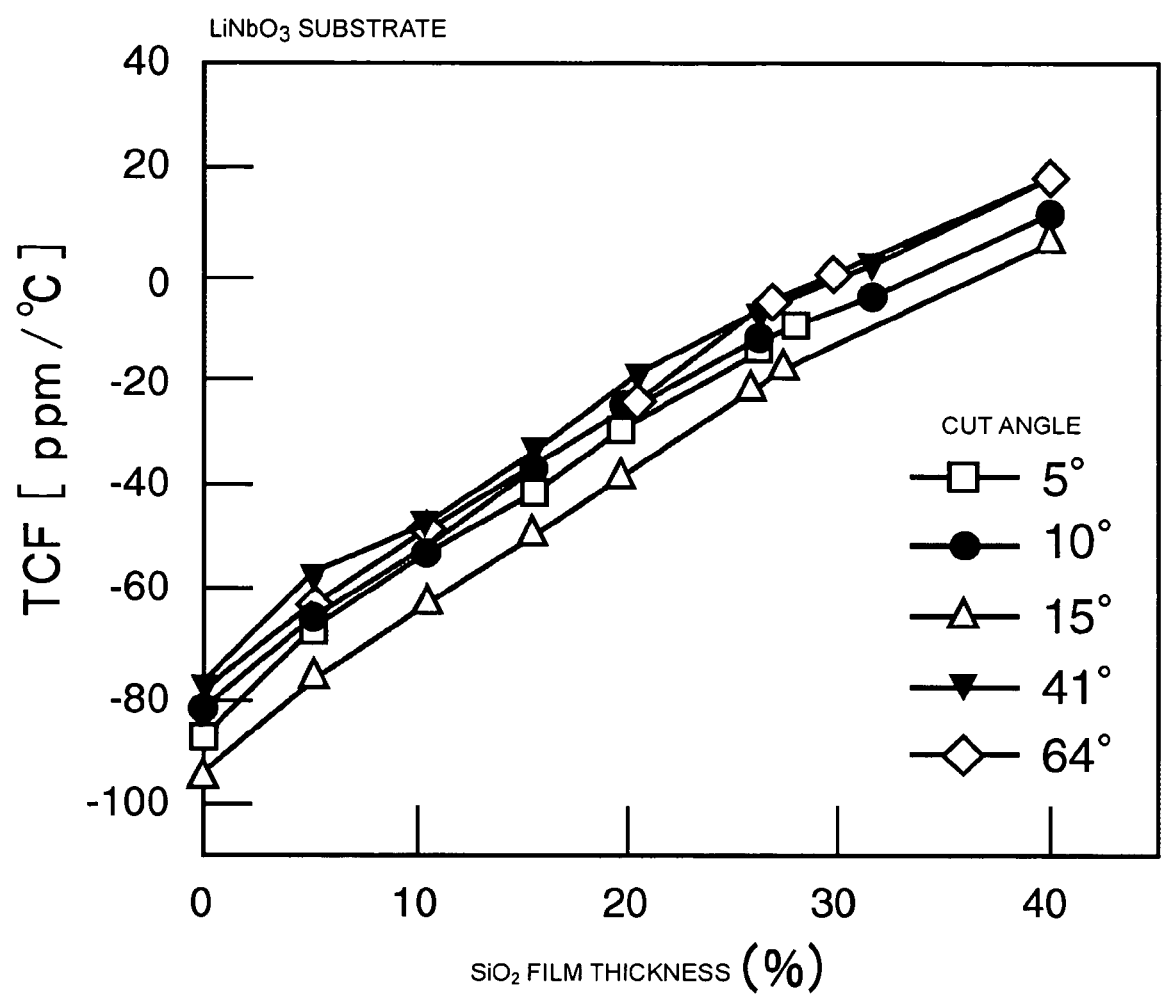
FIG. 8 shows the change of the temperature coefficient of frequency TCF in a case where, in the surface acoustic wave device of a preferred embodiment of the present invention, LiNbO$_3$ substrates of various cut angles are used, and the film thickness of the SiO$_2$ film is changed.
Figure 9A:
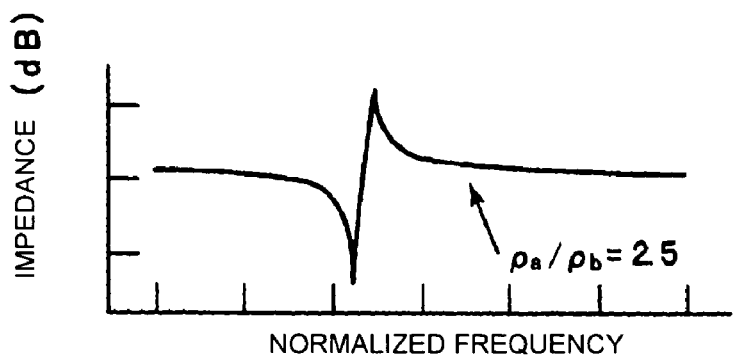
FIGS. 9A, 9B, 9C, 9D, and 9E show changes of impedance versus frequency characteristics in a case where the average density $\rho_a$ of an electrode film/the average density $\rho_b$ of an insulating film is changed.
Figure 9B:
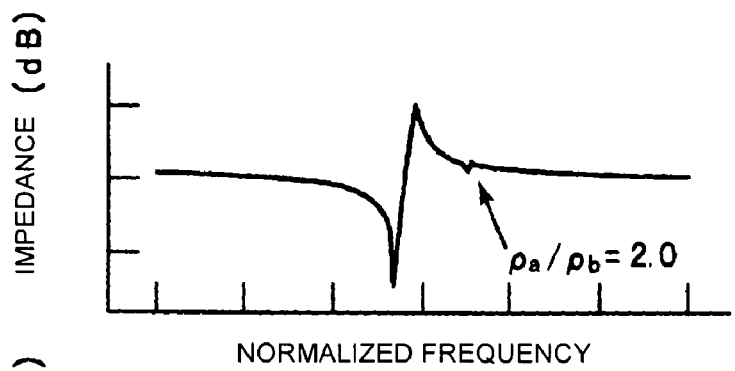
Figure 9C:
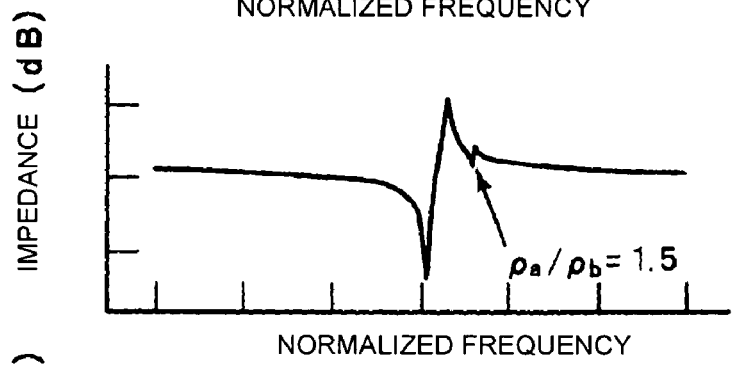
Figure 9D:
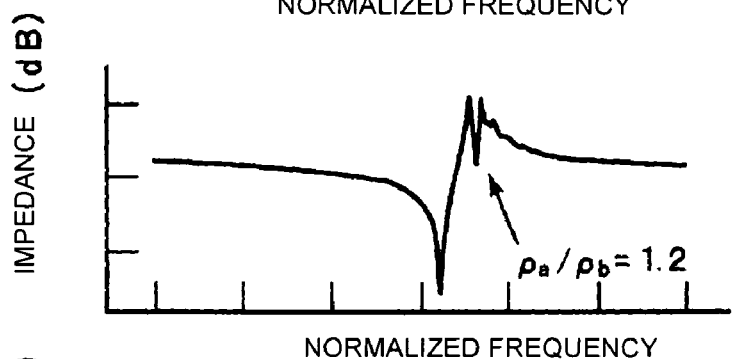
Figure 9E:
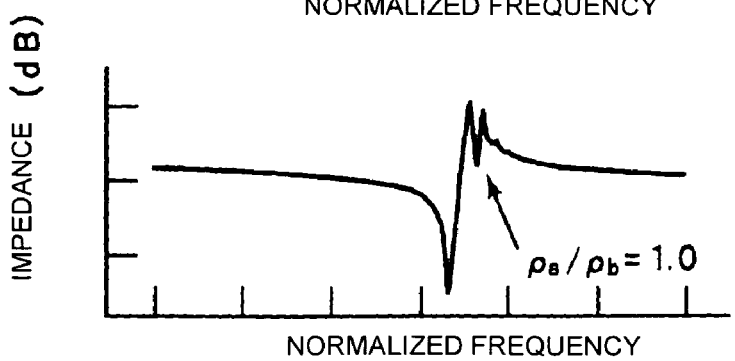

As is clear from FIGS. 7 and 8, the temperature coefficient of frequency TCF is improved by the formation of the $SiO_2$ film; in particular, when the film thickness Hs/λ of the $SiO_2$ film is about 0.15 to about 0.40, the temperature coefficient of frequency TCF can be approximately ½ or less of the case where an $SiO_2$ film is not formed.

It was ascertained by the inventors of the present invention that the results of FIGS. 7 and 8, generally, depend on the relationship between the electrode average density of the electrode fingers of the IDT, that is, the average metal density $\rho_a$ of the area where the electrode fingers are provided, and the density $\rho_b$ of the insulating film formed between the electrode fingers regardless of the relationship between the thickness of the electrode made from Al and the thickness of the SiO$_2$ film. That is, the surface acoustic wave device 1 was formed similarly to the above-described preferred embodiment by changing $\rho_a/\rho_b$ in various ways, that is, by variously changing the insulating film material and the electrode film material, and the impedance versus frequency characteristics were measured. The results are shown in FIGS. 9A to 9E.

As is clear from FIGS. 9A to 9E, when $\rho_a/\rho_b$ is about 1.5 or less, ripples begin to appear in the vicinity of the anti-resonance frequency. Therefore, it can be seen that, when the average density of the electrodes is less than or equal to about 1.5 times the average density of the insulating film, by using the end surface reflection shown in the preferred embodiment, the above-mentioned ripples can be removed.

Therefore, it can be seen that, as the insulating film, which is not limited to the SiO$_2$ film, in order to improve piezoelectricity, a protective film, or Ta$_2$O$_5$, ZnO, or other suitable material, for defining a protective film, can be used. That is, in the present invention, the insulating film is not limited to the SiO$_2$ film.

Figure 10:
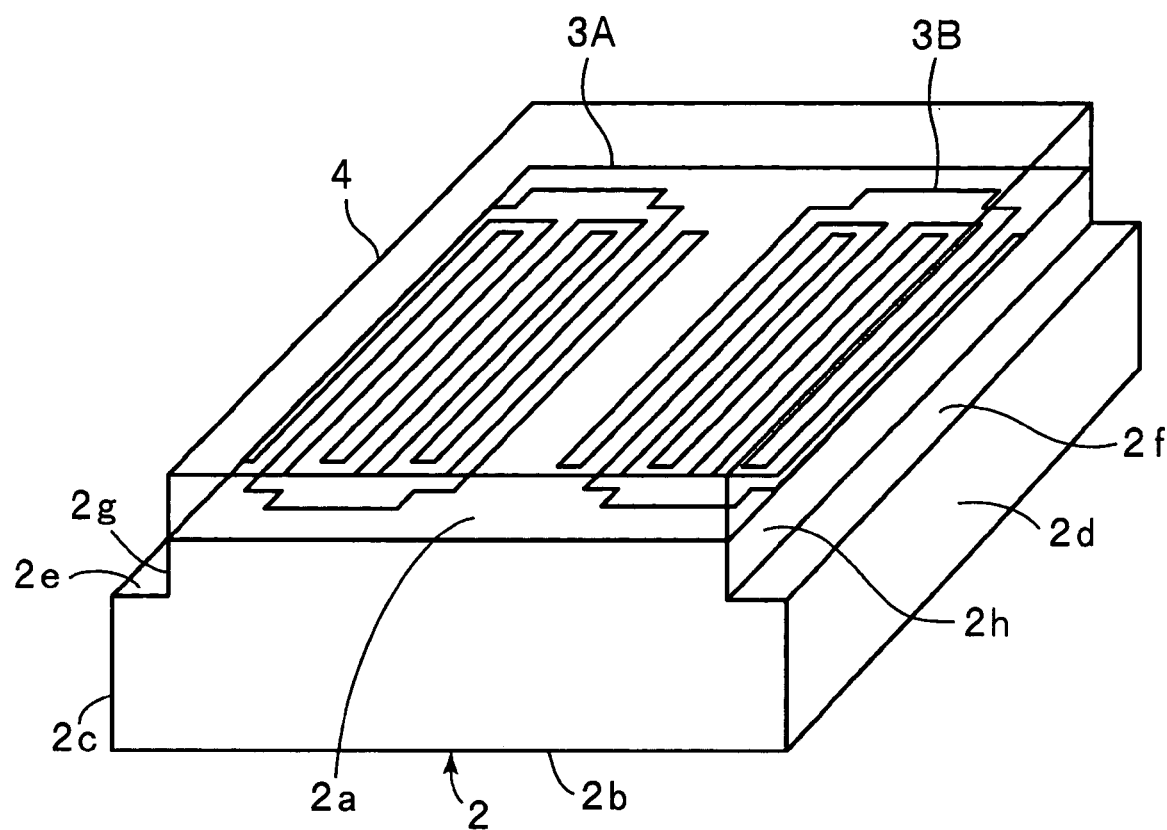
FIG. 10 is a schematic perspective view illustrating an example of an end surface reflection type surface acoustic wave filter to which preferred embodiments of the present invention is applied.

Although in the above-described preferred embodiment, a one-port-type end surface reflection type surface acoustic wave resonator is described, the present invention, which is not limited to a surface acoustic wave resonator, can be applied to various end surface reflection type surface acoustic wave resonators. FIG. 10 is a schematic perspective view showing a 2-IDT-type resonator filter as an example of such a surface acoustic wave filter. Here, on the piezoelectric substrate 2, IDTs 3A and 3B are arranged along the propagation direction of the surface acoustic wave. The 2-IDT-type resonator filter is formed similarly to the surface acoustic wave device 1 of the above-described preferred embodiment except that the two IDTs 3A and 3B are formed.

Not only the resonator-type surface acoustic wave filter, but also various surface acoustic wave filters, such as ladder-type or lattice-type surface acoustic wave filters, can be formed in accordance with the present invention.

The present invention is not limited to each of the above-described preferred embodiments, and various modifications are possible within the range described in the claims. An embodiment obtained by appropriately combining technical features disclosed in each of the different preferred embodiments is included in the technical scope of the present invention.

What is claimed is:

1. An end surface reflection type surface acoustic wave device comprising:
   a piezoelectric substrate having two opposing end surfaces on which a surface acoustic wave is reflected;
   an electrode film made of at least one of Al and an alloy including Al as a major component on said piezoelectric substrate and which defines at least one interdigital transducer; and
   an insulating film arranged on said piezoelectric substrate so as to cover said electrode film; wherein
   a top surface of the insulating film is planarized such that irregularities between portions of the top surface of the insulating film disposed above electrode fingers of the at least one interdigital transducer and portions of the top surface of the insulating film disposed between the electrode fingers are approximately 30% or less than the film thickness of the interdigital transducer, and a ratio of the average density of said electrode film to the density of the insulating film is less than or equal to about 1.5.

2. An end surface reflection type surface acoustic wave device according to claim 1, wherein said insulating film is made of SiO$_2$.

3. An end surface reflection type surface acoustic wave device according to claim 1, wherein said piezoelectric substrate is made of at least one of LiTaO$_3$ and LiNbO$_3$.

4. An end surface reflection type surface acoustic wave device according to claim 2, wherein said piezoelectric substrate is made of at least one of LiTaO$_3$ and LiNbO$_3$.

5. An end surface reflection type surface acoustic wave device according to claim 2, wherein, when the wavelength of the surface acoustic wave is denoted as $\lambda$, the film thickness Hs/$\lambda$ of said insulating film made from SiO$_2$ is in the range of about 0.15 to about 0.40.

6. An end surface reflection type surface acoustic wave device according to claim 1, wherein said electrode film defines one interdigital transducer and is a surface acoustic wave resonator.

7. An end surface reflection type surface acoustic wave device according to claim 1, wherein said end surface reflection type surface acoustic wave device is one of a resonator-type filter, a ladder-type filter, and a lattice-type surface acoustic wave filter.

8. An end surface reflection type surface acoustic wave device according to claim 1, wherein said end surface reflection type surface acoustic wave device is a one-port-type surface acoustic wave resonator.

9. An end surface reflection type surface acoustic wave device according to claim 1, wherein the piezoelectric substrate is a 36° rotated Y-plate X-propagation LiTaO$_3$ substrate.

10. An end surface reflection type surface acoustic wave device according to claim 1, wherein the piezoelectric substrate has a substantially rectangular shape.

11. An end surface reflection type surface acoustic wave device according to claim 1, wherein the piezoelectric substrate includes sides having step differences at a position of a middle height.

12. An end surface reflection type surface acoustic wave device according to claim 11, wherein portions of the sides above the step differences define reflection end surfaces.

13. An end surface reflection type surface acoustic wave device according to claim 12, wherein the reflection end surfaces extend substantially parallel to each other and are planarized surfaces.

14. An end surface reflection type surface acoustic wave device according to claim 11, wherein portions of the sides below the step differences have roughened surfaces.

15. An end surface reflection type surface acoustic wave device according to claim 1, wherein the at least one interdigital transducer includes a pair of comb electrodes.

16. An end surface reflection type surface acoustic wave device according to claim 1, wherein the at least one interdigital transducer is made of Al.

* * * * *